(12) United States Patent
Ching et al.

(10) Patent No.: US 9,691,621 B2
(45) Date of Patent: Jun. 27, 2017

(54) SILICIDE REGION OF GATE-ALL-AROUND TRANSISTOR

(71) Applicant: Taiwan Semiconductor Manufacturing Company, Ltd., Hsin-Chu (TW)

(72) Inventors: Kuo-Cheng Ching, Zhubei (TW); Chi-Wen Liu, Hsin-Chu (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/172,396

(22) Filed: Jun. 3, 2016

(65) Prior Publication Data

US 2016/0276160 A1 Sep. 22, 2016

Related U.S. Application Data

(62) Division of application No. 14/485,457, filed on Sep. 12, 2014, now Pat. No. 9,397,159.

(51) Int. Cl.
| | |
|---|---|
| *H01L 21/336* | (2006.01) |
| *H01L 21/285* | (2006.01) |
| *H01L 29/06* | (2006.01) |
| *H01L 29/78* | (2006.01) |
| *H01L 29/423* | (2006.01) |
| *H01L 29/66* | (2006.01) |
| *H01L 29/45* | (2006.01) |

(Continued)

(52) U.S. Cl.
CPC .. *H01L 21/28518* (2013.01); *H01L 21/28531* (2013.01); *H01L 21/324* (2013.01); *H01L 29/0676* (2013.01); *H01L 29/42392* (2013.01); *H01L 29/458* (2013.01); *H01L 29/665* (2013.01); *H01L 29/66666* (2013.01); *H01L 29/66795* (2013.01); *H01L 29/785* (2013.01); *H01L 29/7827* (2013.01); *H01L 29/78618* (2013.01); *H01L 29/78642* (2013.01); *H01L 29/78696* (2013.01); *B82Y 15/00* (2013.01); *H01L 2029/7858* (2013.01); *Y10S 977/938* (2013.01)

(58) Field of Classification Search
CPC ............. H01L 21/28518; H01L 21/324; H01L 21/823487; H01L 29/66666; H01L 21/823418
USPC .......... 257/E21.375, E29.262, E29.274, 328, 257/329; 438/212, 268
See application file for complete search history.

(56) References Cited

U.S. PATENT DOCUMENTS

| | | | |
|---|---|---|---|
| 7,456,470 | B2 | 11/2008 | Jones |
| 2003/0116792 | A1 | 6/2003 | Chen et al. |

(Continued)

*Primary Examiner* — Kimberly Rizkallah
*Assistant Examiner* — Maria Ligai
(74) *Attorney, Agent, or Firm* — Slater Matsil, LLP

(57) ABSTRACT

The disclosure relates to a semiconductor device and methods of forming same. A representative structure for a semiconductor device comprises a substrate; a nanowire structure protruding from the substrate having a channel region disposed between a source region and a drain region; a pair of silicide regions extending into opposite sides of the source region, wherein each of the pair of silicide regions comprise a vertical portion adjacent to the source region and a horizontal portion adjacent to the substrate; and a metal gate surrounding a portion the channel region.

20 Claims, 11 Drawing Sheets

(51) Int. Cl.
*H01L 21/324* (2006.01)
*H01L 29/786* (2006.01)
*B82Y 15/00* (2011.01)

(56) References Cited

U.S. PATENT DOCUMENTS

| | | |
|---|---|---|
| 2005/0275010 A1 | 12/2005 | Chen et al. |
| 2010/0187601 A1* | 7/2010 | Masuoka ............ H01L 29/7827 257/329 |
| 2010/0291743 A1 | 11/2010 | Nishi et al. |
| 2011/0253981 A1 | 10/2011 | Rooyackers et al. |
| 2012/0052640 A1 | 3/2012 | Fischer et al. |
| 2013/0187279 A1* | 7/2013 | Surthi ................ H01L 27/1052 257/773 |
| 2013/0240983 A1* | 9/2013 | Larrieu ................ B82Y 10/00 257/329 |

* cited by examiner

SILICIDE REGION OF GATE-ALL-AROUND TRANSISTOR

PRIORITY CLAIM AND CROSS-REFERENCE

This application is a divisional of U.S. patent application Ser. No. 14/485,457 filed on Sep. 12, 2014, entitled "Silicide Region of Gate-All-Around Transistor," which application is hereby incorporated herein by reference.

BACKGROUND

The disclosure relates to integrated circuit fabrication, and more particularly to a semiconductor device with a silicide region.

As the semiconductor industry has progressed into nanometer technology nodes in pursuit of higher device density, higher performance, and lower costs, challenges from both fabrication and design issues have resulted in the development of three-dimensional designs, such as a gate-all-around (GAA) transistor. A typical GAA transistor enables enhanced control of the charge carriers along the lengthwise direction through a complete encirclement of the channel region of a semiconductor nanowire by a gate dielectric and a gate electrode. The GAA transistor has a reduced short channel effect, because the channel region may be surrounded by the gate electrode so that an effect of the source/drain region on an electric field of the channel region may be reduced.

However, there are challenges to implementation of such features and processes in complementary metal-oxide-semiconductor (CMOS) fabrication. For example, less silicide formation on source region causes high contact resistance of source regions of the GAA transistor, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3-15A are cross-sectional views of a semiconductor device taken along the line a-a of FIG. 2A at various stages of fabrication according to various embodiments of the present disclosure; and FIGS. 12B-15B are cross-sectional views of a semiconductor device taken along the line a-a of FIG. 2A at various stages of fabrication according to various embodiments of the present disclosure.

DETAILED DESCRIPTION

Figure 1:
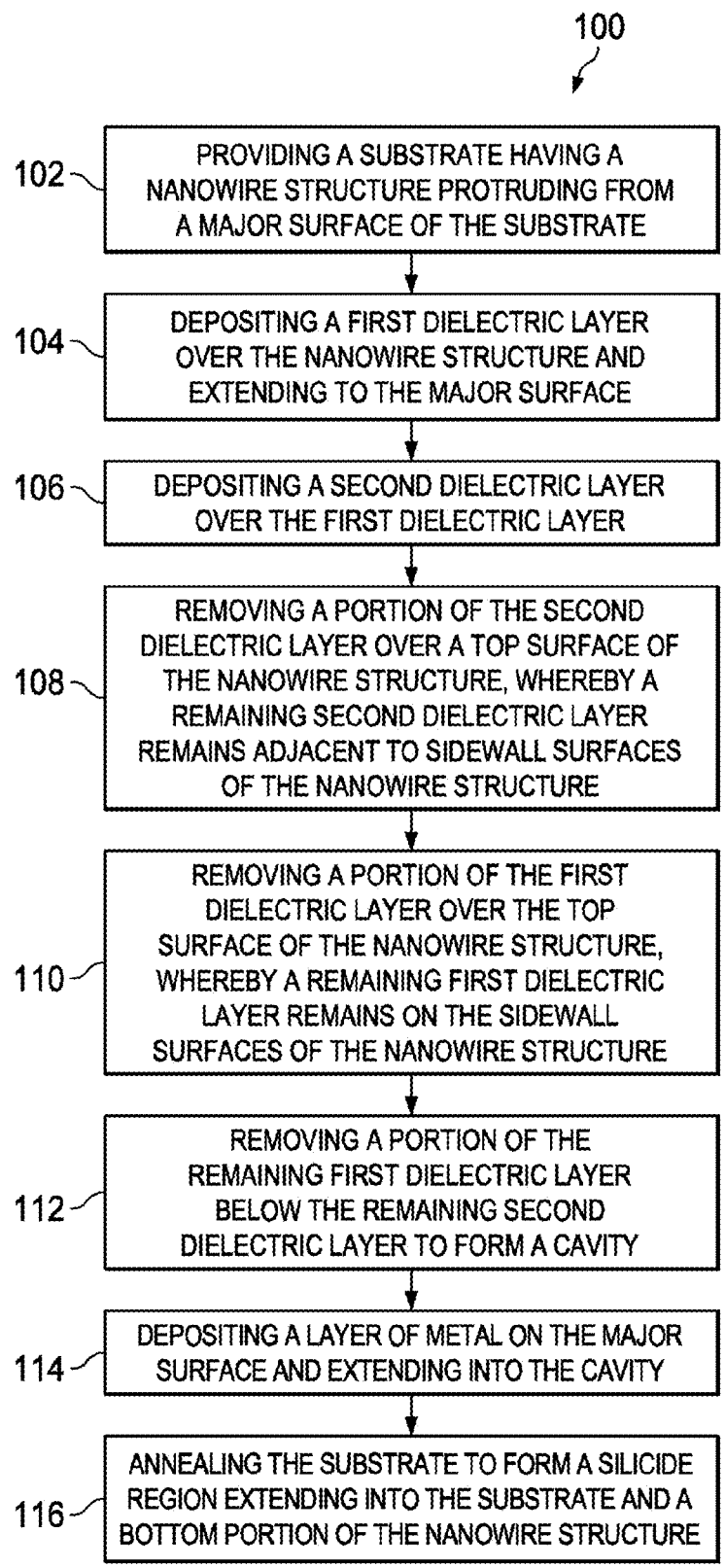
FIG. 1 is a flowchart illustrating a method of fabricating a silicide region of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a silicide region of a semiconductor device according to various aspects of the present disclosure. The method 100 begins with step 102 in which a substrate having a nanowire structure protruding from a major surface of the substrate is provided. The method 100 continues with step 104 in which a first dielectric layer is deposited over the nanowire structure and extending to the major surface. The method 100 continues with step 106 in which a second dielectric layer is deposited over the first dielectric layer.

The method 100 continues with step 108 in which a portion of the second dielectric layer over a top surface of the nanowire structure is removed, whereby a remaining second dielectric layer remains adjacent to sidewall surfaces of the nanowire structure. The method 100 continues with step 110 in which a portion of the first dielectric layer over the top surface of the nanowire structure is removed, whereby a remaining first dielectric layer remains on the sidewall surfaces of the nanowire structure.

The method 100 continues with step 112 in which a portion of the remaining first dielectric layer below the remaining second dielectric layer is removed to form a cavity. The method 100 continues with step 114 in which a layer of metal is deposited on the major surface and extending into the cavity. The method 100 continues with step 116 in which the substrate is annealed to form a silicide region extending into the substrate and a bottom portion of the nanowire structure. The discussion that follows illustrates embodiments of semiconductor devices that can be fabricated according to the method 100 of FIG. 1.

Figure 2A:
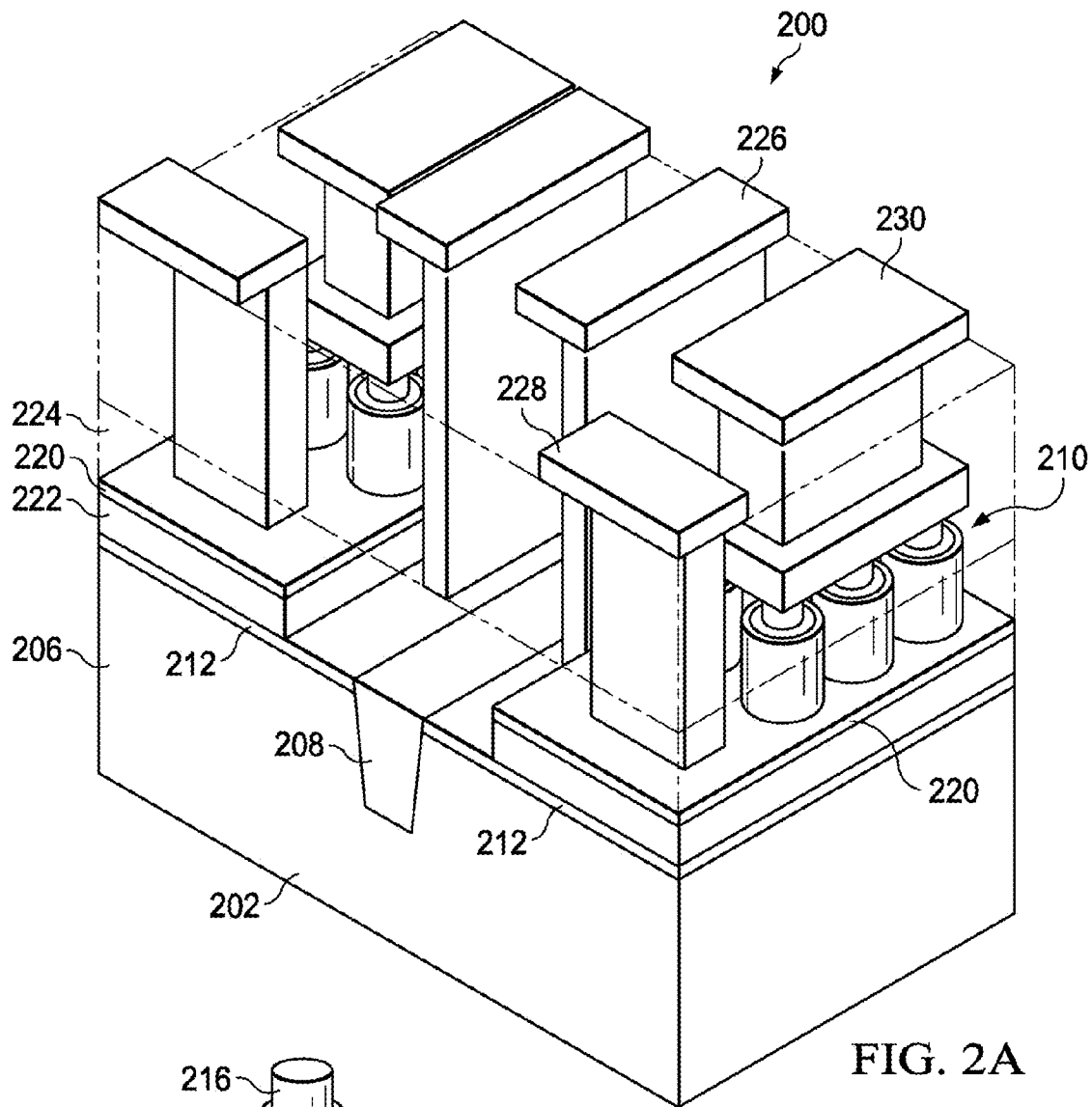
FIG. 2A is a perspective view of a semiconductor device according to various aspects of the present disclosure.
Figure 2B:
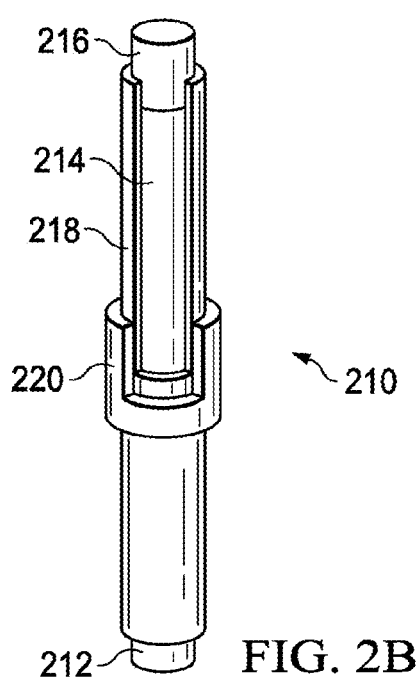
FIG. 2B is an enlarged perspective view of a semiconductor device according to various aspects of the present disclosure.

FIG. 2A is a perspective view of a semiconductor device 200 according to various aspects of the present disclosure. FIG. 2B is an enlarged perspective view of a semiconductor device 200 according to various aspects of the present disclosure. FIGS. 3-15A are cross-sectional views of a semiconductor device 200 taken along the line a-a of FIG. 2A at various stages of fabrication according to various embodiments of the present disclosure. FIGS. 12B-15B are cross-sectional views of a semiconductor device 300 taken along the line a-a of FIG. 2A at various stages of fabrication according to various embodiments of the present disclosure. As employed in the present disclosure, the term semiconductor device 200, 300 refers to a gate-all-around (GAA) transistor and is hereinafter referred to as a GAA transistor 200, 300. The GAA transistor 200, 300 refers to any nanowire-based, multi-gate transistor. Other transistor structures and analogous structures are within the contemplated scope of the disclosure. The GAA transistor 200, 300 may be included in a microprocessor, memory cell, and/or other integrated circuit (IC).

It is noted that the method of FIG. 1 does not produce a completed GAA transistor 200, 300. A completed GAA transistor 200, 300 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 15B are simplified for a better understanding of the concepts of the present disclosure. For example, although the figures illustrate the GAA transistor 200, 300, it is understood the IC may comprise a number of other devices comprising resistors, capacitors, inductors, fuses, etc.

Referring to FIGS. 2A and 2B, the GAA transistor 200 is fabricated on a substrate 202 using nanowire technology. In one embodiment, the substrate 202 comprises a silicon substrate or a $SiGe_x$ substrate. In alternative embodiments, the substrate 202 comprises a silicon-on-insulator (SOI) structure or a $SiGe_x$-on-insulator structure. In some embodiments, the substrate 202 may comprise various doped regions 206 depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions 206 may be configured for an n-type GAA transistor, or alternatively configured for a p-type GAA transistor. In some embodiments, the substrate 202 may include isolation regions 208 to isolate the various doped regions 206.

In some embodiments, the GAA transistor 200 further includes a source region 212 in the substrate 202, one or more nanowire structures 210, and a metal gate 220 surrounding a channel region 214 of the nanowire structures 210. In the depicted embodiment, the metal gate 220 (also see FIGS. 15A and 15B) extends out from the nanowire structure 210 for making electrical contact to a gate contact 228. The nanowire structures 210 in this example are oriented in a vertical direction and extend upwardly from the source region 212. In other examples, the nanowire structures 210 may extend in other directions such as a horizontal direction (not shown). Also, although nanowires with a circular cross-sectional shape are shown in this example, in other examples the cross-sectional shape may include square, triangular, elliptical, rectangular, trapezoidal, or other shapes. The example nanowire structure 210 comprises semiconductor material such as silicon that is used to form the channel region 214 between the source region 212 and a drain region 216. The drain region 216 in this example is at the far end section of the nanowire structure 210 opposite the source region 212 and may comprise a silicide region (not shown). Gate dielectric 218 is also shown surrounding the nanowire structure 210.

In some embodiments, the GAA transistor 200 further includes a first isolation feature 222 above the substrate 202 and surrounding an upper portion of the source region 212. In some embodiments, the GAA transistor 200 further includes a second isolation feature 224 above the first isolation feature 222 and surrounding an upper portion of the gate electrode 220. Metal contacts are also included in the GAA transistor 200. In this example, shown are a source contact 226, the gate contact 228 and a drain contact 230.

The number of nanowires needed in a design may be a function of the drive current required for the semiconductor device 200. By increasing the drive current per nanowire, the number of nanowires required to produce the desired drive current may be reduced. For simplicity and clarification, each nanowire structure 210 of each GAA transistor 200 comprises one nanowire (shown in FIGS. 6-15A), although it may comprise more nanowires (shown in FIG. 2A).

Referring to FIGS. 3-7 and step 102 in FIG. 1, a substrate 202 having a nanowire structure 210 protruding from a major surface 202s (see FIG. 6) of the substrate 202 is provided. In one embodiment, a pad layer 204a and a mask layer 204b are formed on a top surface 202t of the substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent lithography processes.

Figure 3:
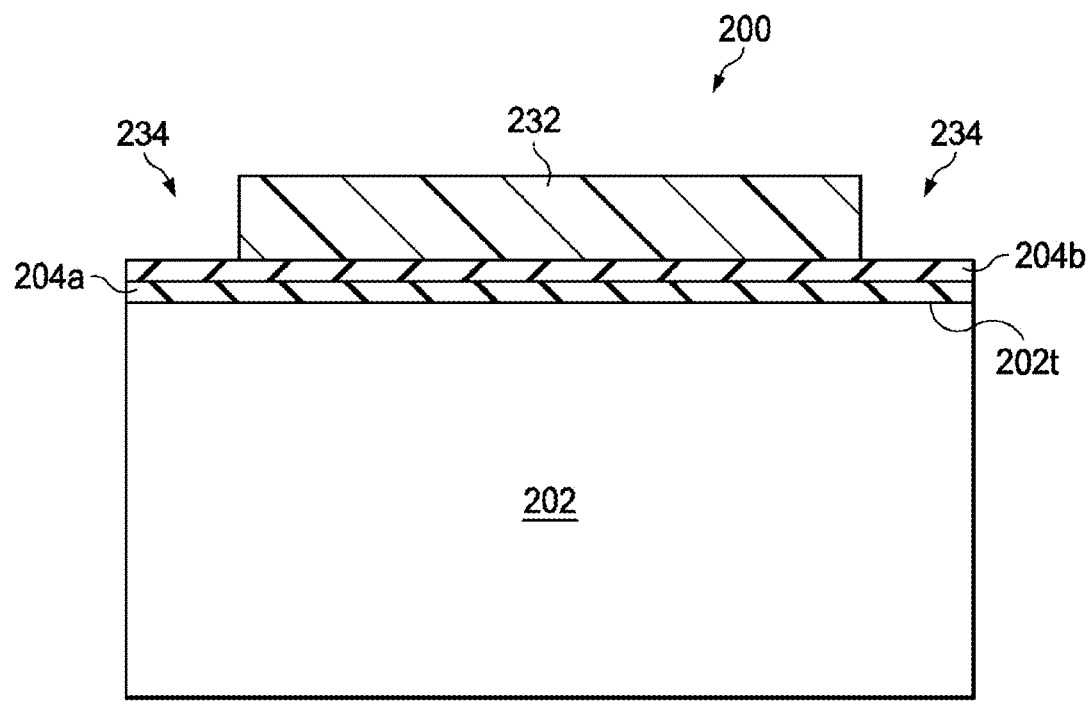

A photo-sensitive layer 232 is formed on the mask layer 204b and is then patterned, forming openings 234 in the photo-sensitive layer 232 (shown in FIG. 3). In some embodiment, the lithography processes include forming a photo-sensitive layer 232 by spin-on coating; exposing the photo-sensitive layer 232 using an exposure energy, such as ultraviolet (UV) light, and developing the exposed photo-sensitive layer 232 to form the patterned photo-sensitive layer 232 (i.e., openings 234) using a developing chemical. In another example, the lithography process includes spin-on coating, soft baking, exposing, post-exposure baking, developing, and hard baking. In other embodiment, the lithography process to form the patterned photoresist layer 232 may alternatively use other technique, such as e-beam lithography, maskless patterning, or molecular print.

Figure 4:
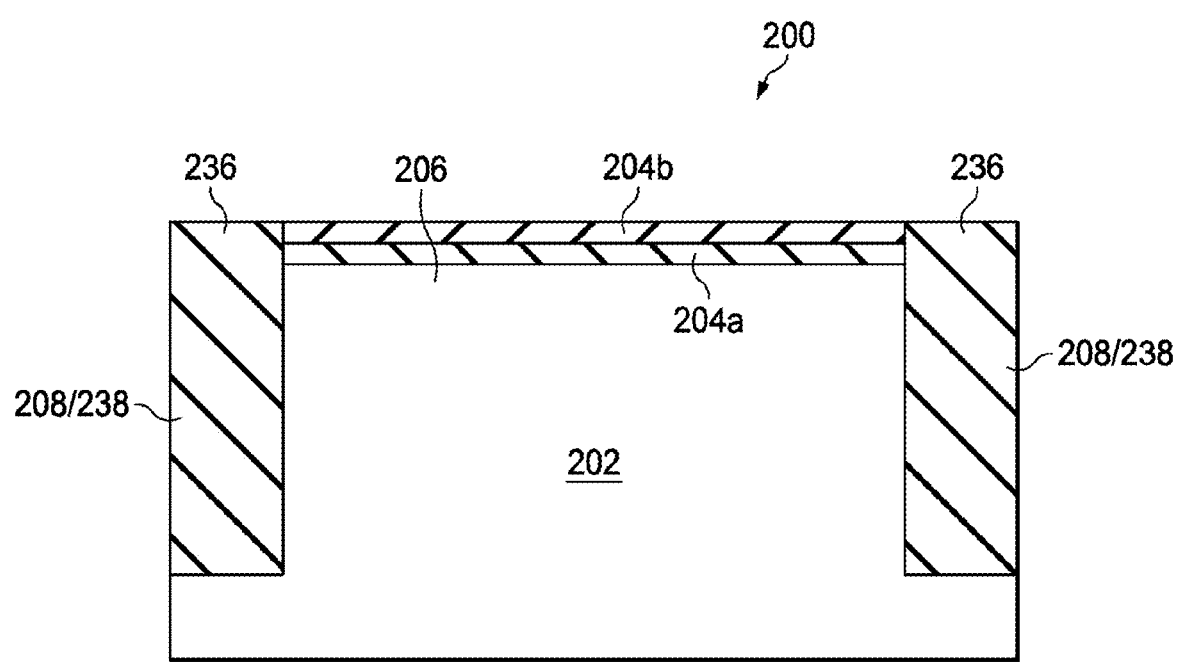

Subsequently, the structure in FIG. 4 is produced by forming the isolation regions 208 to isolate the doped region 206 for the GAA transistor 200 and the other doped region for the other GAA transistor (not shown). The mask layer 204b and pad layer 204a are etched through openings 234 to expose underlying semiconductor substrate 202. The exposed semiconductor substrate 202 is then etched to form trenches 236 in the semiconductor substrate 202. The photo-sensitive layer 206 is then removed. Next, a cleaning may be performed to remove a native oxide of the semiconductor substrate 202. The cleaning may be performed using diluted hydrofluoric (DHF) acid.

Trenches 236 are then filled with a dielectric material 238, followed by a chemical mechanical polish (CMP) to form the isolation regions 208. The dielectric material 238 may include silicon oxide, and hence is also referred to as oxide 238 in the present disclosure. In some embodiments, other dielectric materials, such as silicon nitride, silicon oxynitride, fluoride-doped silicate glass (FSG), or a low-K dielectric material, may also be used. In an embodiment, the oxide 238 may be formed using a high-density-plasma (HDP) CVD process, using silane ($SiH_4$) and oxygen ($O_2$) as reacting precursors. In other embodiment, the oxide 238 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 238 may be formed using a spin-on-dielectric (SOD) process, such as hydrogen silsesquioxane (HSQ) or methyl silsesquioxane (MSQ).

Figure 5:
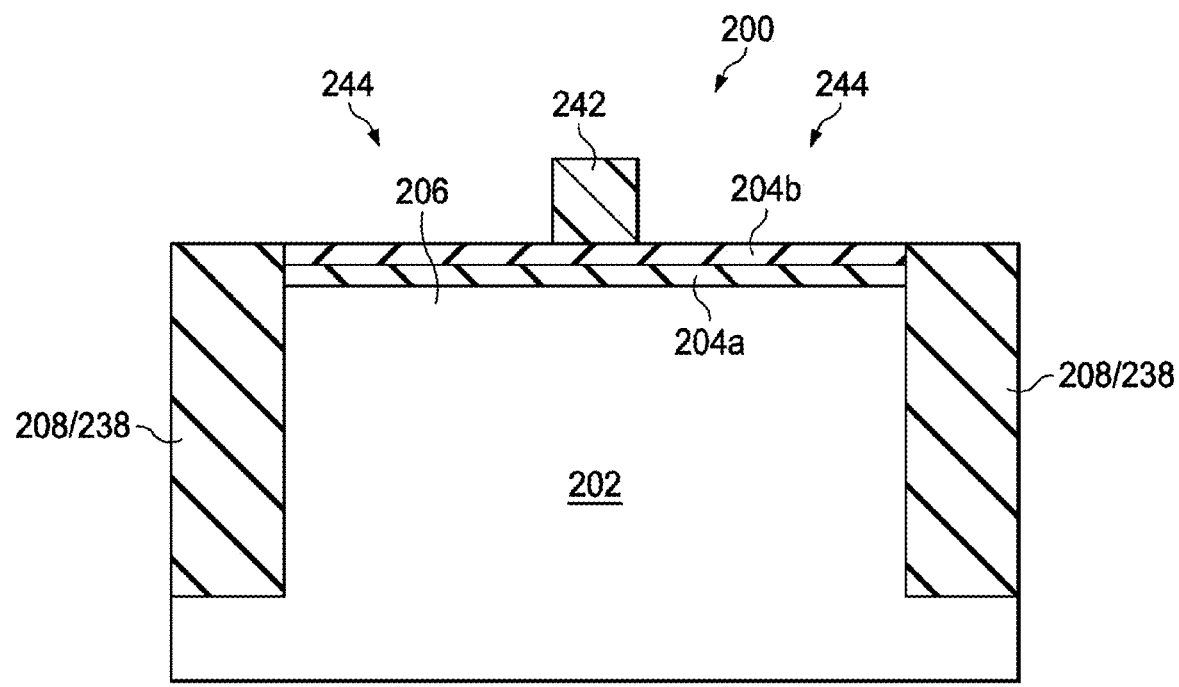

Referring to FIG. 5, after formation of the isolation regions 208, a photo-sensitive layer 242 is formed on the mask layer 204b and is then patterned, forming openings 244 in the photo-sensitive layer 242 to define areas for semiconductor nanowire structures on the semiconductor substrate 202.

Figure 6:
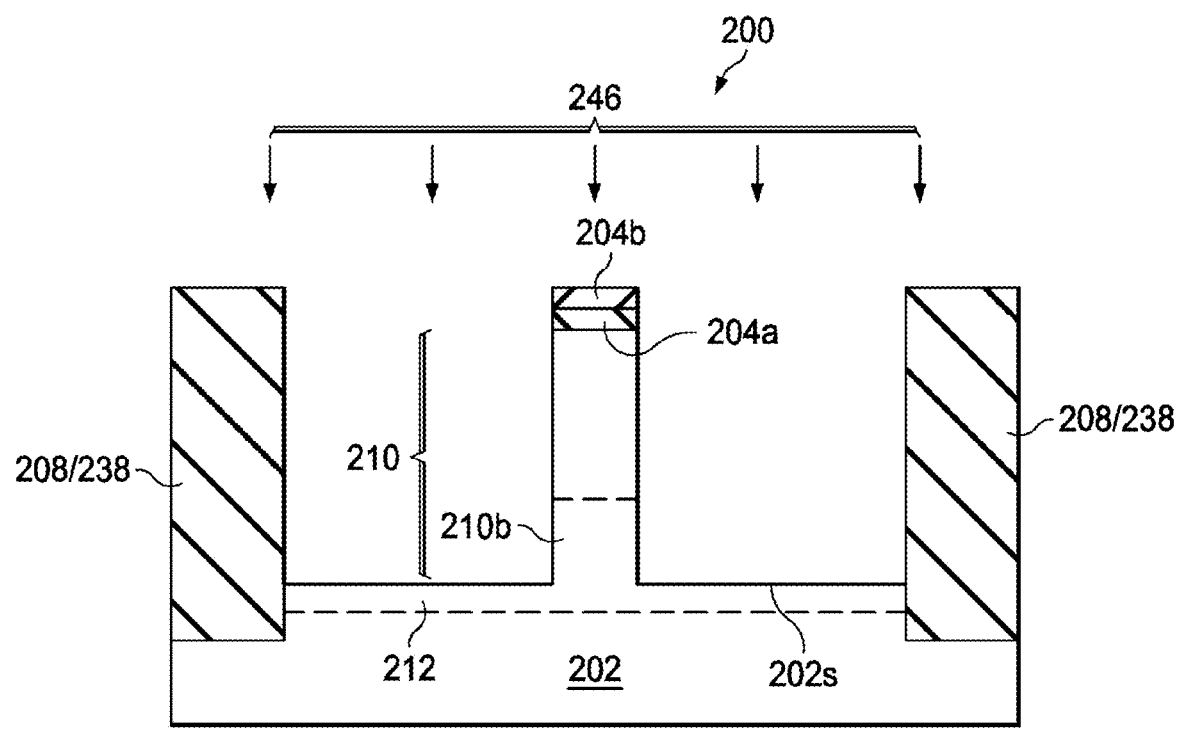

FIG. 6 depicts the resulting structure after forming a nanowire structure 210 protruding from a major surface 202s of the substrate 202. The mask layer 204b and pad layer 204a are etched through openings 244 to expose underlying semiconductor substrate 202. The exposed semiconductor substrate 202 is then etched to form the nanowire structure 210 in the semiconductor substrate 202. The photo-sensitive layer 242 is then removed. Next, a cleaning may be performed to remove a native oxide of the semiconductor substrate 202. The cleaning may be performed using diluted hydrofluoric (DHF) acid.

In some embodiments, the heavily doped source region 212 is formed by an ion implantation process 246 in a bottom portion 210b of the nanowire structure 210 and further extended to the semiconductor substrate 202 below the major surface 202s for low resistance contact. This is achieved via ion implantation of boron or phosphorous, at an energy between about 5 to 150 KeV, at a dose between about 1E15 to 1E 16 atoms/cm$^2$. The source region 212 includes an n-type dopant (such as phosphorous) when the GAA transistor 200 is n-type or a p-type dopant (such as boron) when the GAA transistor 200 is p-type.

In some embodiments, the source region 212 formed by the ion implantation 246 is further annealed for activation by an annealing process. The annealing process is implemented right after the ion implantation 246 or is alternatively implemented after the formation of other doped features for collective activation. In one embodiment, the annealing process includes rapid thermal annealing (RTA). In other embodiments, the annealing process alternatively includes laser annealing, spike annealing, millisecond anneal (MSA) or other suitable annealing technique.

Figure 7:
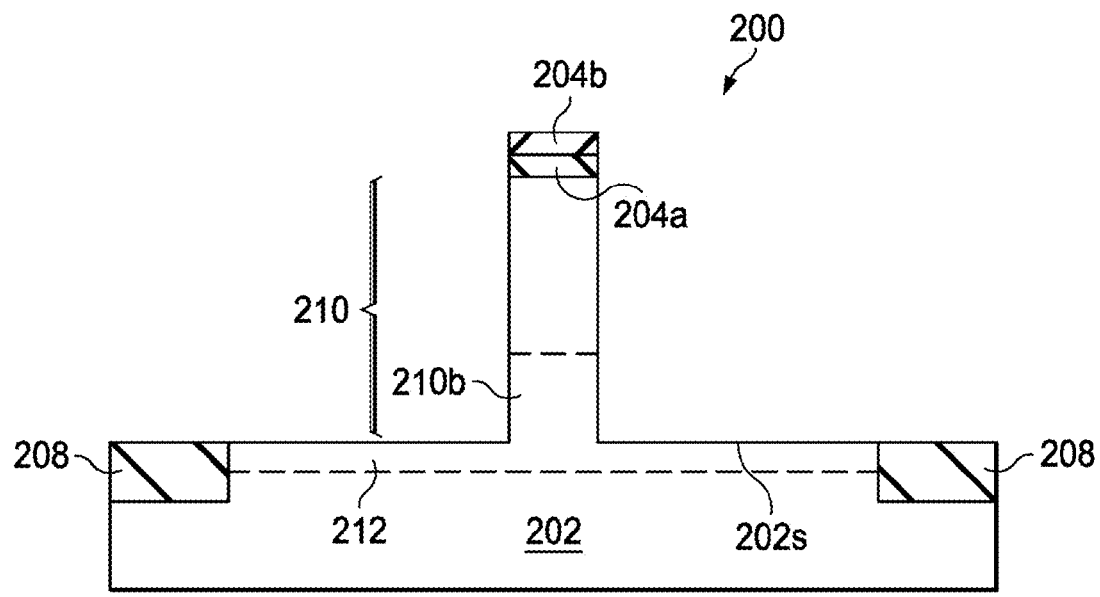

Then, a sacrificial dielectric material layer (not shown) is formed by depositing a dielectric material (similar to the oxide 238) using chemical vapor deposition (CVD), physical vapor deposition (PVD), or spin-on process, performing a CMP process to remove a portion of the dielectric material above the nanowire structure 210, and etching back the dielectric material and the oxide 238 simultaneously to the major surface 202s to define the isolation region 208 (shown in FIG. 7).

Figure 8:
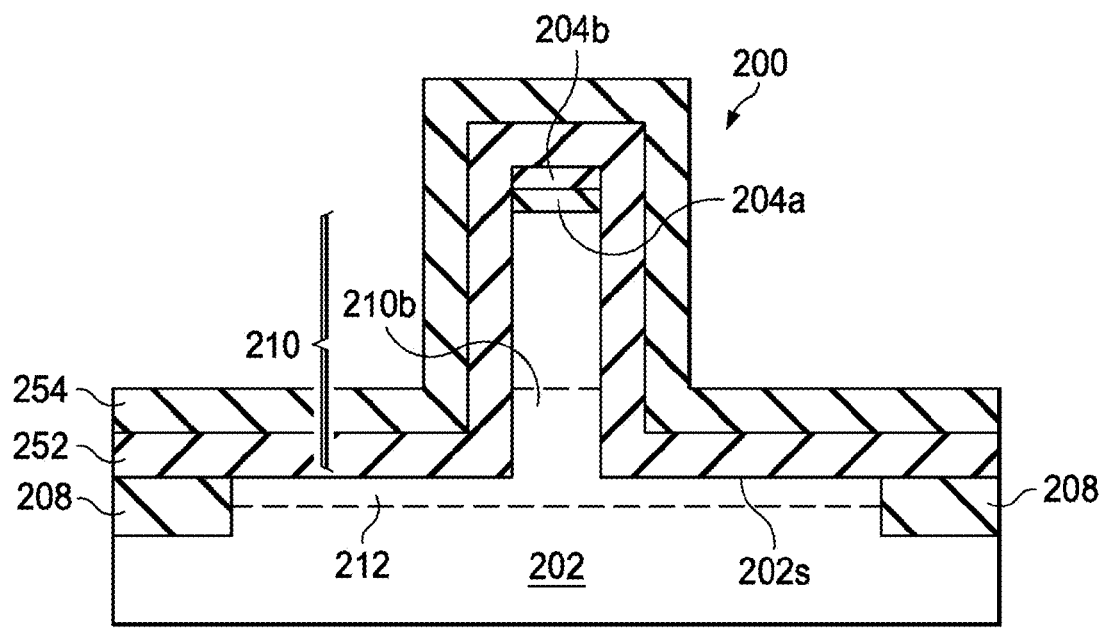

As depicted in FIG. 8 and step 104 in FIG. 1, for fabricating a cavity (such as a cavity 256 shown in FIG. 10) to form a low-resistance silicide region on the source region 212, the structure in FIG. 8 is produced by depositing a first dielectric layer 252 over the nanowire structure 210 and extending to the major surface 202s. In some embodiments, the first dielectric layer 252 may comprise silicon oxide or silicon oxynitride. In some embodiments, the first dielectric layer 252 can be deposited using a chemical vapor deposition (CVD) or an atomic layer deposition (ALD) process. For example, the first dielectric layer 252 comprising silicon oxide can be deposited under a pressure less than 10 mTorr and a temperature of about 350° C. to about 500° C., such as about 450° C., using silane (SiH$_4$) and N$_2$O as reacting precursors.

Then, the structure in FIG. 8 is produced by depositing a second dielectric layer 254 over the first dielectric layer 252 (step 106 in FIG. 1). In the present embodiment, the second dielectric layer 254 comprises silicon nitride or carbon-doped silicon nitride. In some embodiments, the second dielectric layer 254 may be deposited using a molecular layer deposition (MLD) process. The MLD process of the present disclosure is generally carried out under a pressure less than 10 mTorr and in the temperature range from about 350° C. to about 500° C., such as about 450° C. In one embodiment, the silicon nitride is deposited over the first dielectric layer 252 by reacting a silicon source compound and a nitrogen source. The silicon source compound provides silicon to the deposited silicon nitride and may be silane (SiH$_4$) or tetraethoxysilane (TEOS). The nitrogen source provides nitrogen to the deposited silicon nitride and may be ammonia (NH$_3$) or nitrogen gas (N$_2$).

Figure 9:
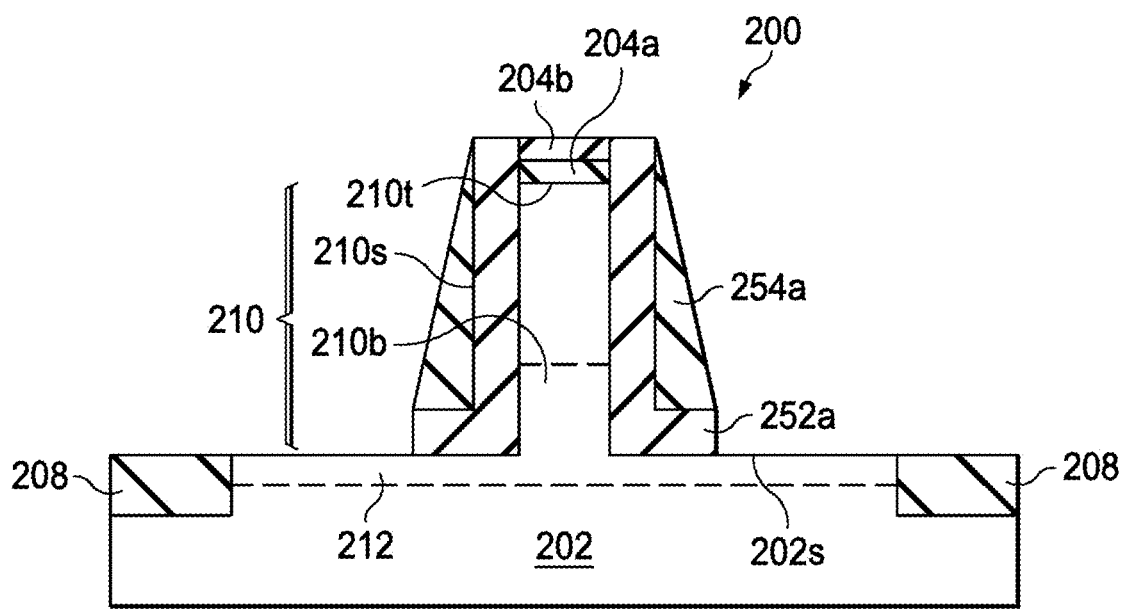

The method 100 in FIG. 1 continues with step 108 in which the structure in FIG. 9 is produced by removing a portion of the second dielectric layer 254 over a top surface 210t of the nanowire structure 210 using a dry etching process (e.g., anisotropic etching), whereby a remaining second dielectric layer 254a remains adjacent to sidewall surfaces 210s of the nanowire structure 210. In some embodiments, the dry etching process to etch the second dielectric layer 254 (such as silicon nitride) may be performed under a source power of about 150 W to about 220 W, and a pressure of about 10 mTorr to about 45 mTorr, using CH$_2$F$_2$, O$_2$, He, and Ar as etching gases.

The method 100 in FIG. 1 continues with step 110 in which the structure in FIG. 9 is produced by removing a portion of the first dielectric layer 252 over the top surface 210t of the nanowire structure 210 using a dry etching process (e.g., anisotropic etching), whereby a remaining first dielectric layer 252a remains on the sidewall surfaces 210s of the nanowire structure 210. The dry etching process may have a high selectivity such that the dry etching process does not etch into the major surface 202s of the substrate 202. In some embodiments, the dry etching process to etch the first dielectric layer 252 (such as silicon oxide) may be performed under a glow discharge and a pressure of about 10 mTorr to about 3 Torr, using fluorocarbon gas, such as CF$_4$, C$_2$F$_6$, C$_3$F$_8$, CHF$_3$, or CH$_2$F$_2$, as etching gases.

The process steps up to this point have provided the substrate 202 having the remaining first dielectric layer 252a on the sidewall surfaces 210s of the nanowire structure 210. Conventionally, silicide regions over the exposed major surface 202s may be formed by blanket depositing a thin layer of metal material, such as nickel, titanium, cobalt, and combinations thereof. The substrate 202 is then heated, which causes silicon to react with the metal where contacted. After the reaction, a layer of metal silicide is formed between the silicon-containing material and the metal. The un-reacted metal is selectively removed through the use of an etchant that attacks the metal material but does not attack silicide.

However, the small space between the remaining first dielectric layer 252a and adjacent isolation region 208 may impede metal material from entering into the small space, resulting in silicide formation with small volume. This small-volume silicide region causes high contact resistance of source regions of the GAA transistor and thus degrade the device performance.

Accordingly, the processing discussed below with reference to FIGS. 10-12 may remove at least a lateral portion of the remaining first dielectric layer 252a to form a cavity 256 (i.e., to enlarge the space between the nanowire structures 210) to make it easier for metal depositions into the cavity 256. This can help silicide formation in the exposed major surface 202s between the nanowire structures 210, thereby fabricating low contact resistance of source regions of the GAA transistor 200 and thus upgrading device performance.

Figure 10:
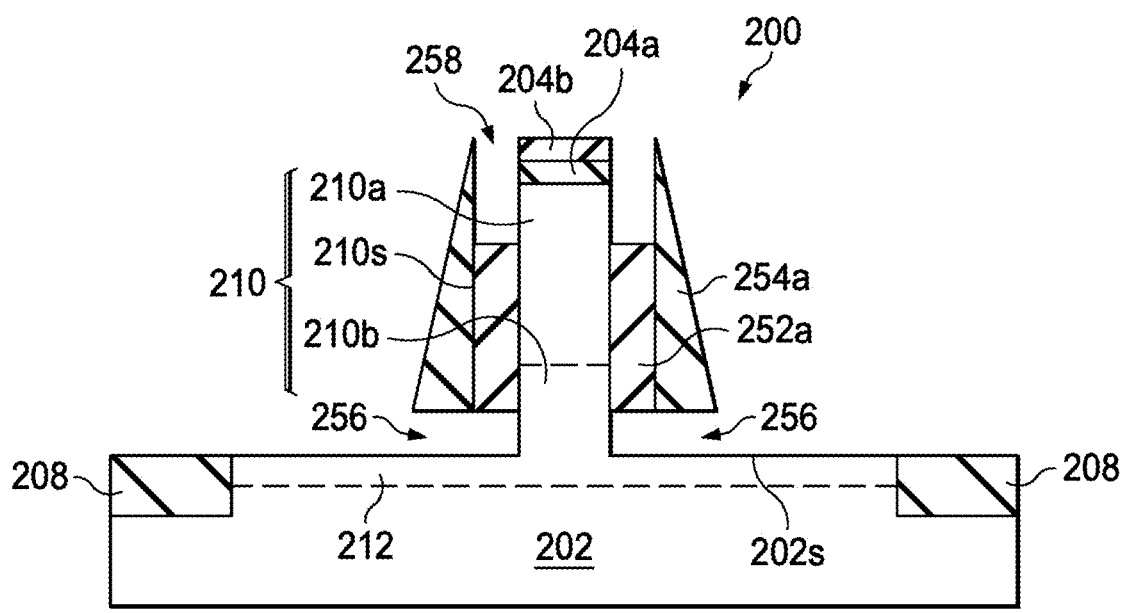

As depicted in FIG. 10 and step 112 in FIG. 1, for fabricating a low-resistance silicide region (such as a silicide region 260 shown in FIGS. 12A and 12B) of the semiconductor device 200, the structure in FIG. 10 is produced by removing a portion of the remaining first dielectric layer 252a below the remaining second dielectric layer 254a to form a source cavity 256 and a drain cavity 258, exposing the bottom portion 210b of the nanowire structure 210 and a top portion 210a of the nanowire structure 210.

In some embodiments, the step of removing a portion of the remaining first dielectric layer 252a below the remaining second dielectric layer 254a to form a cavity 256 is performed by wet etch or vapor etch. In some embodiments, the wet etch is performed by dipping the substrate 202 in hydrofluoric acid (HF). In some embodiments, the vapor etch is performed by exposing a surface of remaining first dielectric layer 252a to a vapor mixture comprising NH3 and a fluorine-containing compound. In some embodiments, the fluorine-containing compound is a compound selected from the group of HF or NF3.

Figure 11:
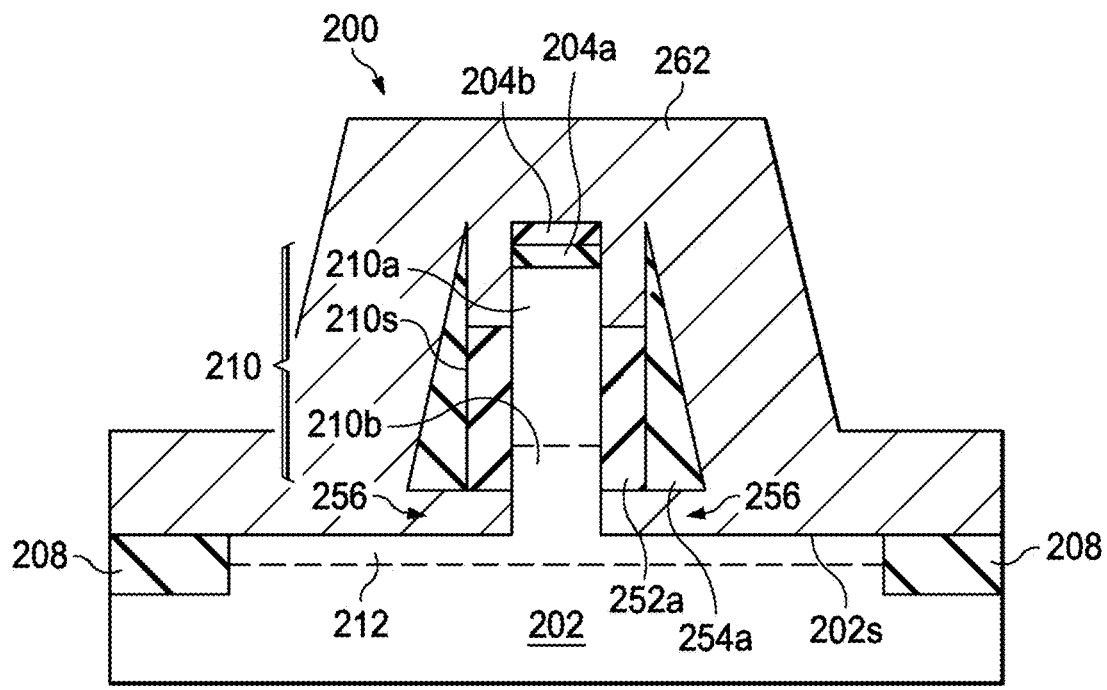

The method 100 in FIG. 1 continues with step 114 in which the structure in FIG. 11 is produced by depositing a layer of metal 262 on the remaining second dielectric layer 254a, the major surface 202s, and extending into the cavity 256. In the depicted embodiment, the layer of metal 262 comprises a material selected from the group consisting of titanium, cobalt, nickel, platinum, erbium, and palladium. The layer of metal 262 may be formed by CVD, ALD, physical vapor deposition (PVD), plating, or other suitable technique.

Figure 12A:
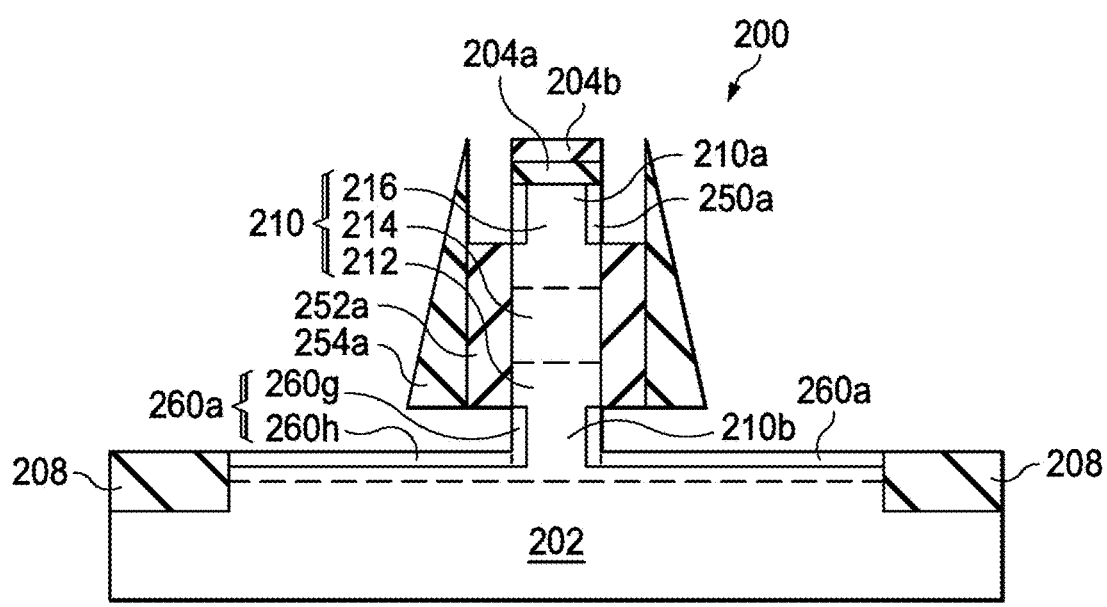
Figure 12B:
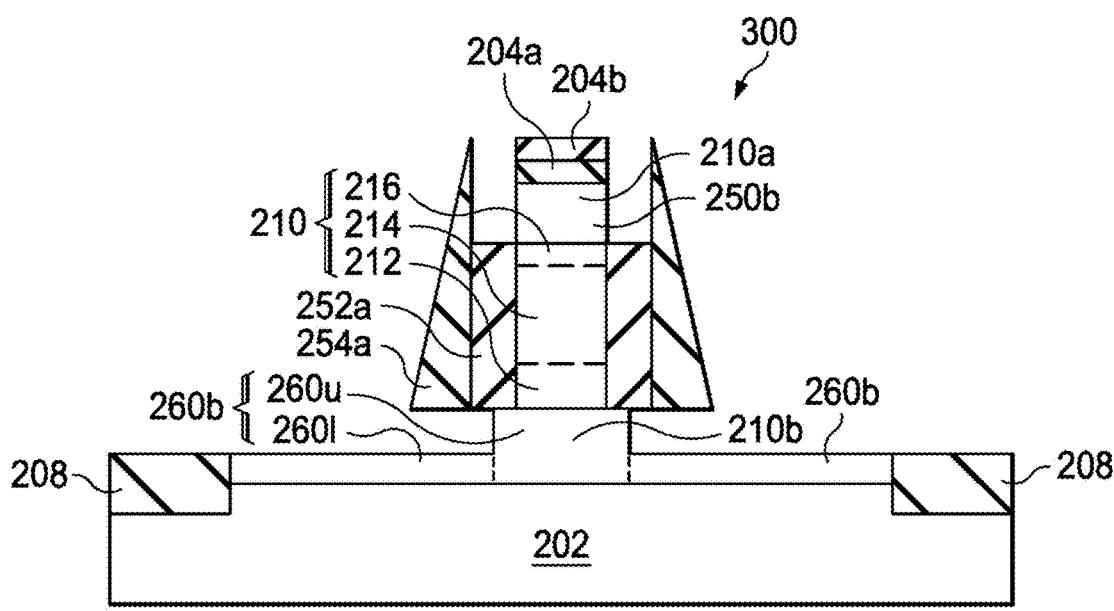

As depicted in FIGS. 12A and 12B and step 116 in FIG. 1, after depositing the layer of metal 262 on the major surface 202s and extending to within the cavity 256, the structures in FIGS. 12A and 12B are produced by annealing the substrate 202 to form a silicide region 260 extending into the substrate 202 and the bottom portion 210b of the nanowire structure 210, while forming another silicide region 250 extending into the top portion 210a of the nanowire structure 210. In some embodiments, the silicide regions 250, 260 comprise titanium silicide, cobalt silicide, nickel silicide, platinum silicide, erbium silicide, or palladium silicide. In some embodiments, the silicide region 260 may be conformal (hereinafter referred to as a silicide region 260a of the GAA transistor 200, such as shown in FIG. 12A) or non-uniform (hereinafter referred to as a silicide region 260b of the GAA transistor 300, such as shown in FIG. 12B). The non-uniform silicide region 260b with more silicide volume has a lower resistance than the conformal silicide region 260a with less silicide volume.

Figure 13A:
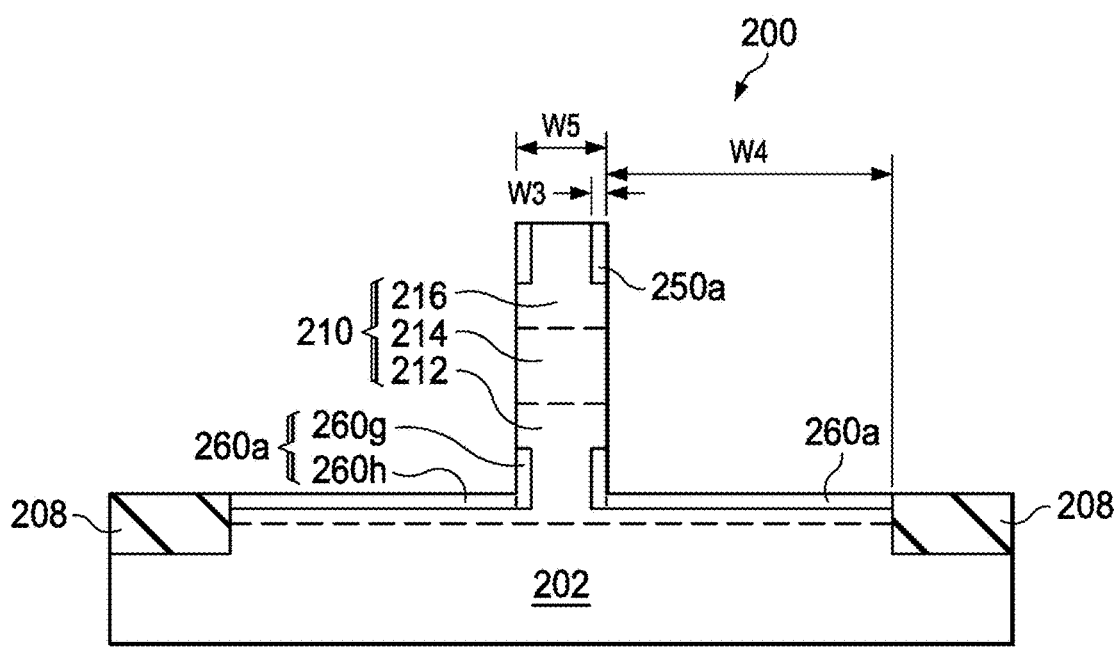

In the conformal embodiment, the silicide region 260 is a pair of silicide regions 260a extending into opposite sides of the source region 212, each of the pair of silicide regions 260a comprising a vertical portion 260g adjacent to the source region portion 212 of the nanowire 210 and a horizontal portion 260h adjacent to the substrate 202 (shown in FIGS. 12A and 13A). In some embodiments, another silicide region 250 is a pair of silicide regions 250a extending into opposite sides of the drain region 216.

In the conformal embodiment, a first RTA process is applied to the substrate 202 at a temperature between about 200° C. and about 300° C. and for between about 10 seconds and about 20 seconds. The layer of metal 262 in contact with the silicon substrate 202 and in contact with the source region 212 of the nanowire 210 and in contact with the drain region 216 of the nanowire 210 will form a high-resistance silicide. Then, the remaining un-reacted layer of metal 262 may be etched away using, for example, a solution comprising $NH_4OH$, $H_2O_2$, and deionized water. In order to transform the high-resistance silicide to a low-resistance silicide 260a, a second RTA process is applied to the substrate 202 at a temperature between about 300° C. and about 500° C. and for between about 10 seconds and about 30 seconds.

Figure 13B:
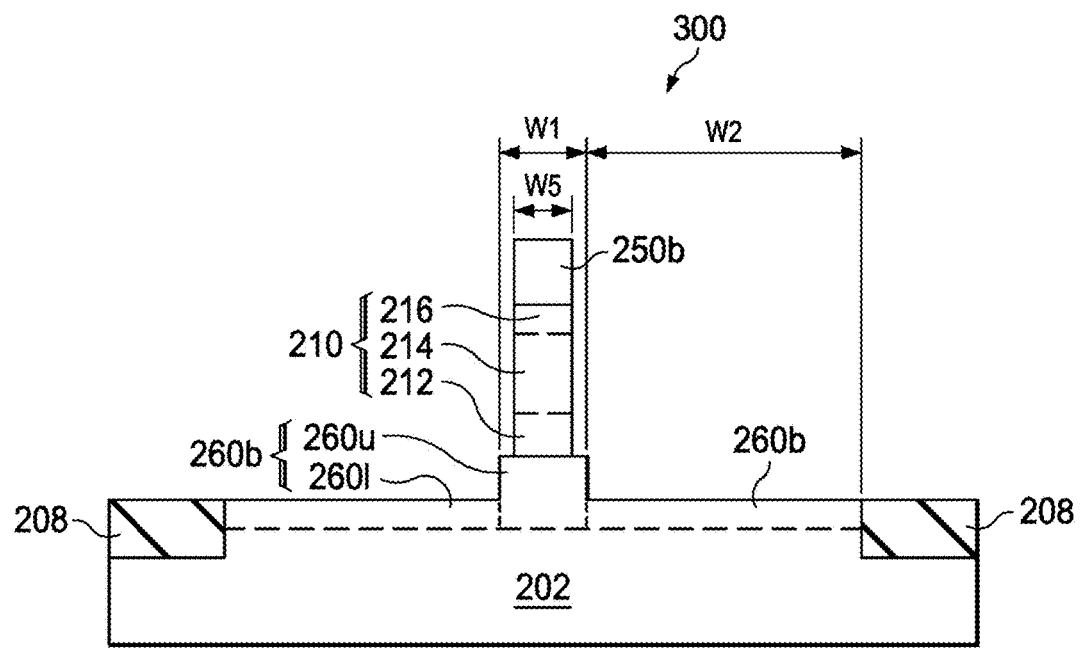

In the non-uniform embodiment, the silicide region 260b is between the source region 212 and the substrate 202, wherein the silicide region 260b comprises an upper portion 260u adjacent to the source region 212 of the nanowire 210 having a first width $W_1$ and a lower portion 260l adjacent to the substrate 202 having a second width $W_2$ greater than the first width $W_1$ (shown in FIGS. 12B and 13B). In some embodiments, the silicide region 250b is over the drain region 216.

In the non-uniform embodiment, a first RTA process is applied to the substrate 202 at a temperature between about 200° C. and about 300° C. and for between about 20 seconds and about 30 seconds. The layer of metal 262 in contact with the silicon substrate 202 and in contact with the source region 212 of the nanowire 210 and in contact with the drain region 216 of the nanowire 210 will form a high-resistance silicide. Then, the remaining un-reacted layer of metal 262 may be etched away using, for example, a solution comprising $NH_4OH$, $H_2O_2$, and deionized water. In order to transform the high-resistance silicide to a low-resistance silicide 260b, a second RTA process is applied to the substrate 202 at a temperature between about 300° C. and about 500° C. and for between about 30 seconds and about 60 seconds. Due to a longer duration, the pair of silicide regions 260a may meet each other to form the continuous and non-uniform silicide region 260b, while the pair of silicide regions 250a may meet each other to form the continuous and non-uniform silicide region 250b.

FIGS. 13A and 13B show the semiconductor device 200, 300 of FIGS. 12A and 12B after removing the remaining first dielectric layer 252a, the remaining second dielectric layer 254a, the pad layer 204a, and the mask layer 204b.

In some embodiments, the remaining second dielectric layer 254a and the mask layer 204b are formed of silicon nitride, and the silicon nitride may be removed using a wet process using hot $H_3PO_4$. In other embodiments, the remaining first dielectric layer 252a and the pad layer 204a may be removed using DHF acid, if formed of silicon oxide.

Still referring to FIG. 13A, each of the pair of silicide regions 260a comprises the vertical portion 260g adjacent to the source region 212 214 and the horizontal portion 260h adjacent to the substrate 202. In some embodiments, a ratio of the third width $W_3$ of the vertical portion 260g to a fifth width $W_5$ of the channel region 214 is from 0.1 to 0.5. In some embodiments, a ratio of a third width $W_3$ of the vertical portion 260g to a fourth width $W_4$ of the horizontal portion 260h is from 0.05 to 0.3. In some embodiments, one of the pair of silicide regions 260a is substantially L-shaped.

Still referring to FIG. 13B, the silicide region 260b is between the source region 212 and the substrate 202, wherein the silicide region 260b comprises the upper portion 260u adjacent to the source region 212 having the first width $W_1$ and the lower portion 260l adjacent to the substrate 202 having the second width $W_2$ greater than the first width $W_1$. In some embodiments, a ratio of the first width $W_1$ to the second width $W_2$ is from 0.4 to 0.9. In some embodiments, a ratio of the first width $W_1$ to a fifth width $W_5$ of the channel region 214 is from 1.05 to 1.2. In some embodiments, the silicide region 260b is substantially reverse T-shaped.

Figure 14A:
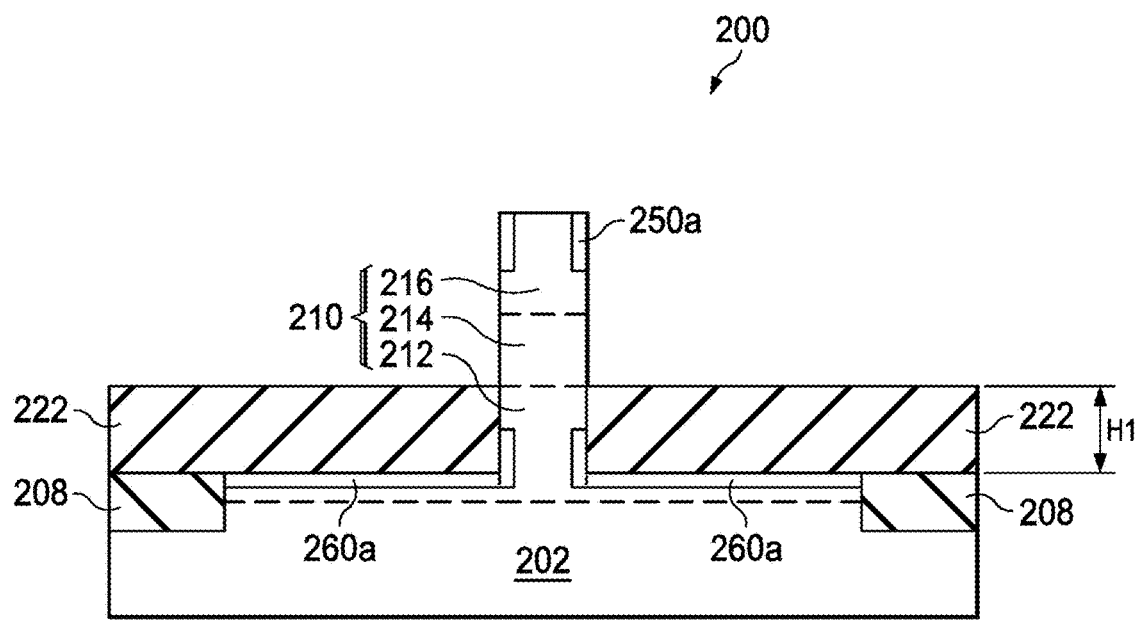
Figure 14B:
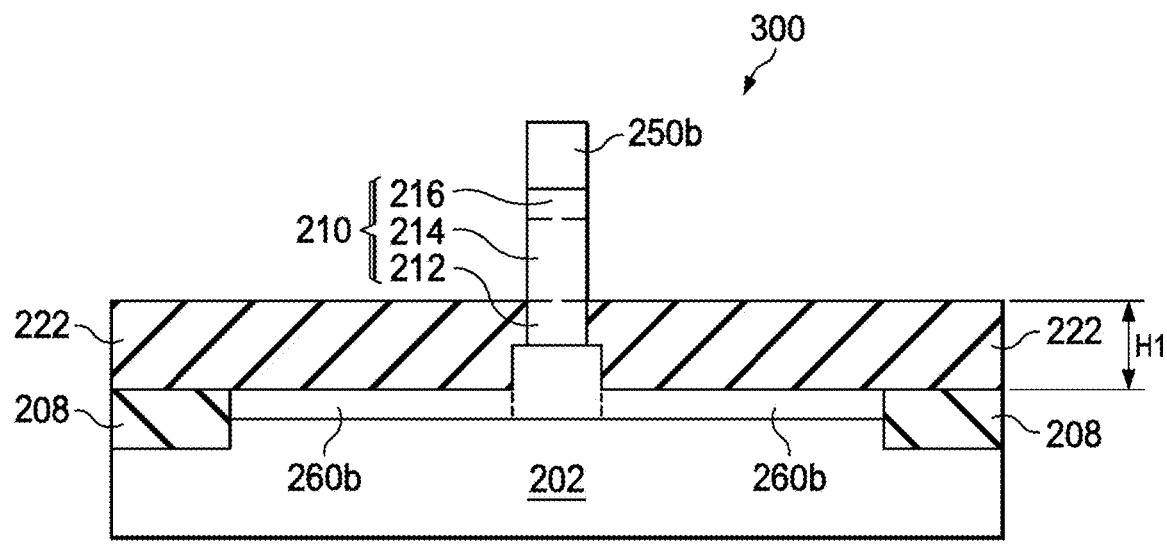

As depicted in FIGS. 14A and 14B, for fabricating an isolation feature to isolate the substrate 202 and a metal gate (such as the metal gate 220 shown in FIGS. 15A and 15B), the structures in FIGS. 14A and 14B are produced by forming a first isolation feature 222 over the silicide region 260 and extending to a first height $H_1$ to define the source region 212 within the nanowire 210. In the depicted embodiment, the first isolation feature 222 provides isolation function to and properly configures various features of the GAA transistor 200. For example, the metal gate 220 is properly aligned with the channel region 214, not directly formed on the semiconductor substrate 202, and is substantially set off from the source region 212. As such, the first isolation feature 222 isolates the substrate 202 and the metal gate 220. In some embodiments, the source region 212 may extend to some distance upward in the nanowire 210.

In some embodiments, the first isolation feature 222 includes a dielectric material, such as silicon oxide in the present example. The first isolation feature 222 may alternatively include other suitable dielectric material, such as silicon nitride, silicon oxynitride, carbon-doped silicon oxide, carbon-doped silicon nitride, or carbon-doped silicon oxynitride. In some embodiment, the forming of the dielectric material layer includes depositing a dielectric material using CVD, PVD, or spin-on process, performing a CMP process to remove a portion of the dielectric material above the nanowire structure 210, and etching back the dielectric material to the first height $H_1$ to define the source region 212.

Figure 15A:
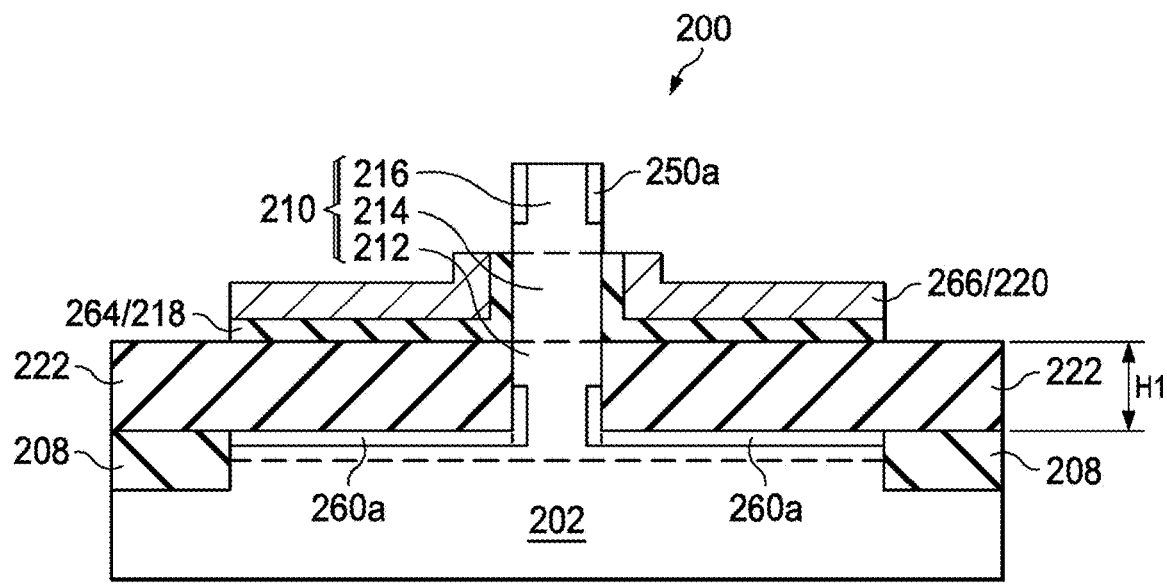
Figure 15B:
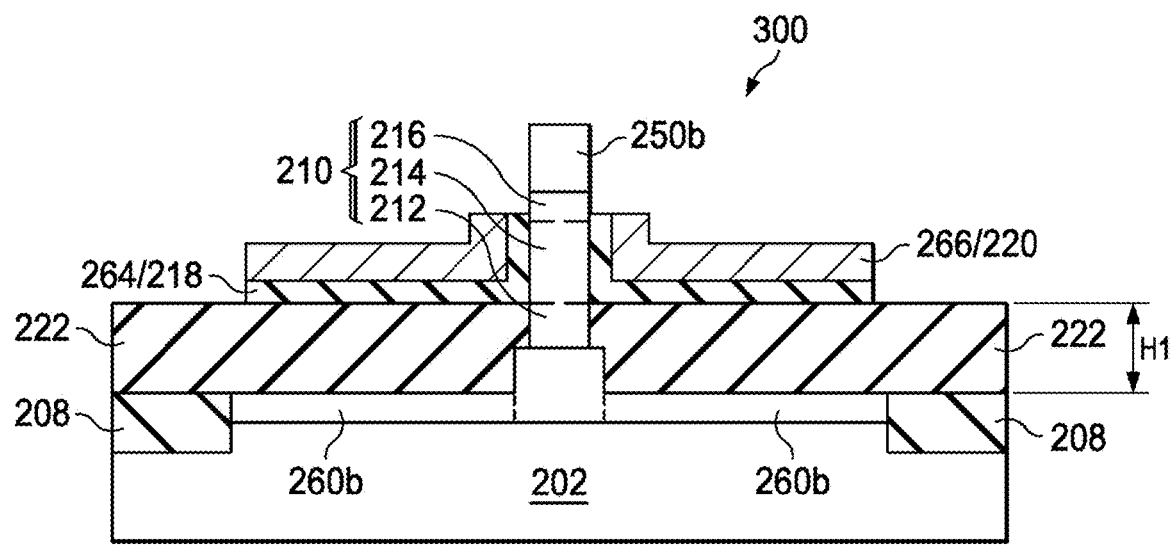

As depicted in FIGS. 15A and 15B, for fabricating the metal gate 220 surrounding the channel region 214 of the nanowire structure 210, the structure in FIGS. 15A and 15B are produced by forming a gate dielectric layer 264 over the nanowire structure 210 and extending over the first isolation feature 222 and the isolation regions 208.

In some embodiments, the gate dielectric layer 264 may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 264 is a high-k dielectric layer with a thickness in the range of about 5 to 30 angstroms. The gate dielectric layer 264 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 264 may further comprise an interfacial layer (not shown) to reduce damage between the gate dielectric 218 and channel region 214 of the nanowire structure 210. The interfacial layer may comprise silicon oxide.

Then, the structure in FIGS. 15A and 15B are produced by forming a layer of metal 266 over the gate dielectric layer 264. In some embodiments, the layer of metal 266 may comprise a single layer or multilayer structure. In the present embodiment, the layer of metal 266 may include a metal such as Al, Cu, W, Ti, Ta, TiN, TiAl, TiAlN, TaN, TaC, NiSi, CoSi, other conductive materials with a work function compatible with the substrate material, or combinations thereof. In the present embodiment, the layer of metal 266 comprises a thickness in the range of about 1 nm to about 10 nm. The layer of metal 266 may be formed using a suitable process such as ALD, CVD, PVD, plating, or combinations thereof.

Subsequent process comprises (1) patterning a photo-sensitive layer (not shown) to expose a portion of the layer of metal 266, (2) removing the exposed portion of the layer of metal 266 and the gate dielectric layer 264 to form the metal gate 220 and the gate dielectric 218 using the patterned photo-sensitive layer as an etch mask, and then (3) removing the patterned photo-sensitive layer. As such, the metal gate 220 surrounds and defines the channel region 214 of the nanowire structure 210.

As such, using sacrificial dielectric layer removal to enlarge the space between the nanowire structures 210 to help silicide formation, problems associated with high contact resistance of source regions due to less silicide formation on source region of the GAA transistor may be reduced and/or avoided. Thus, Applicant's method may achieve the desired device performance characteristics, such as low contact resistance of source regions.

After the steps shown in FIG. 1, as further illustrated with respect to the example depicted in FIGS. 3-15B, have been performed, subsequent processes, comprising drain and interconnect processing, are typically performed to complete the semiconductor device 200, 300 fabrication.

In a representative embodiment, a method for fabricating a semiconductor device includes: forming a nanowire structure protruding from a major surface of a substrate; depositing a first dielectric layer over the nanowire structure and extending to the major surface; depositing a second dielectric layer over the first dielectric layer; removing a portion of the second dielectric layer over a top surface of the nanowire structure, whereby a remaining second dielectric layer remains adjacent to sidewall surfaces of the nanowire structure; removing a portion of the first dielectric layer over the top surface of the nanowire structure, whereby a remaining first dielectric layer remains on the sidewall surfaces of the nanowire structure; removing a portion of the remaining first dielectric layer below the remaining second dielectric layer to form a cavity; depositing a layer of metal on the major surface and extending into to the cavity; and annealing the substrate to form a silicide region extending into the substrate and a bottom portion of the nanowire structure. Removal of a portion of the remaining first dielectric layer below the remaining second dielectric layer to form a cavity may be performed by wet etch or vapor etch.

In another representative embodiment, a method of manufacturing a semiconductor device includes: forming a nanowire structure protruding from a substrate, the nanowire structure comprising a channel region between a source region and a drain region, the channel region having a first width; disposing a silicide region between the source region and the substrate, the silicide region comprising an upper portion adjacent to and annularly surrounding the source region, the upper portion having a second width, and a lower portion adjacent to the substrate and annularly surrounding the source region, the lower portion having a third width greater than the second width, the second width substantially equal to the first width; and surrounding a portion of the channel region with a metal gate. A ratio of the second width to the third width may be from about 0.4 to about 0.9. A ratio of the second width to the first width may be from about 1.05 to about 1.2. An isolation feature may be formed to isolate the substrate and the metal gate. The silicide region may comprise titanium silicide, cobalt silicide, nickel silicide, platinum silicide, erbium silicide, or palladium silicide. The silicide region may be substantially reverse T-shaped. The metal gate may comprise Al, Cu, W, Ti, Ta, TiN, TiAl, TiAlN, TaN, TaC, NiSi, or CoSi. A cross-sectional shape of the nanowire structure may be circular, square, or triangular. A cross-sectional shape of the nanowire structure may be elliptical, rectangular, or trapezoidal.

In yet another representative embodiment, a method of forming a semiconductor device includes: providing a nanowire structure protruding from a substrate, the nanowire structure comprising a channel region between a source region and a drain region, the channel region having a first outer diameter; forming a silicide region, the silicide region comprising a vertical portion adjacent to and annularly disposed around the source region, the silicide region further comprising a horizontal portion adjacent to the substrate and annularly disposed around the source region, wherein a second outer diameter of the vertical portion is substantially equal to the first outer diameter; and disposing a metal gate around a portion of the channel region. A ratio of the second outer diameter to the first outer diameter may be from 0.1 to 0.5. A ratio of the second outer diameter to a third outer diameter of the horizontal portion may be from 0.05 to 0.3. An isolation feature may isolate the substrate and the metal gate. The silicide region may comprise titanium silicide, cobalt silicide, nickel silicide, platinum silicide, erbium silicide, or palladium silicide. The silicide region may be substantially L-shaped. The silicide region may be formed by an annealing process. A cross-sectional shape of the nanowire structure may comprise a circle, a square, or a triangle. A cross-sectional shape of the nanowire structure may comprise an ellipse, a rectangle, or a trapezoid.

In accordance with one embodiment, a semiconductor device comprises a substrate; a nanowire structure protruding from the substrate comprising a channel region between a source region and a drain region; a pair of silicide regions extending into opposite sides of the source region, wherein each of the pair of silicide regions comprising a vertical portion adjacent to the source region and a horizontal portion adjacent to the substrate; and a metal gate surrounding a portion the channel region.

In accordance with another embodiment, a semiconductor device comprises a substrate; a nanowire structure protruding from the substrate comprising a channel region between a source region and a drain region; a silicide region between the source region and the substrate, the silicide region comprising an upper portion adjacent to the source region having a first width and a lower portion adjacent to the substrate having a second width greater than the first width; and a metal gate surrounding a portion the channel region.

In accordance with another embodiments, a method of fabricating a semiconductor device comprises providing a substrate having a nanowire structure protruding from a major surface of the substrate; depositing a first dielectric layer over the nanowire structure and extending to the major surface; depositing a second dielectric layer over the first dielectric layer; removing a portion of the second dielectric layer over a top surface of the nanowire structure, whereby a remaining second dielectric layer remains adjacent to sidewall surfaces of the nanowire structure; removing a portion of the first dielectric layer over the top surface of the nanowire structure, whereby a remaining first dielectric layer remains on the sidewall surfaces of the nanowire structure; removing a portion of the remaining first dielectric layer below the remaining second dielectric layer to form a cavity; depositing a layer of metal on the major surface and extending into the cavity; and annealing the substrate to form a silicide region extending into the substrate and a bottom portion of the nanowire structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, the method comprising:
   forming a nanowire structure protruding from a major surface of a substrate;
   depositing a first dielectric layer over the nanowire structure and extending to the major surface;
   depositing a second dielectric layer over the first dielectric layer;
   removing a portion of the second dielectric layer over a top surface of the nanowire structure, whereby a remaining second dielectric layer remains adjacent to sidewall surfaces of the nanowire structure;
   removing a portion of the first dielectric layer over the top surface of the nanowire structure, whereby a remaining first dielectric layer remains on the sidewall surfaces of the nanowire structure;
   removing a portion of the remaining first dielectric layer below the remaining second dielectric layer to form a cavity;
   depositing a layer of metal on the major surface and extending into to the cavity; and
   annealing the substrate to form a silicide region extending into the substrate and a bottom portion of the nanowire structure.

2. The method of claim 1, wherein removing the portion of the remaining first dielectric layer below the remaining second dielectric layer to form a cavity is performed by wet etch or vapor etch.

3. A method of manufacturing a semiconductor device, the method comprising:
   forming a nanowire structure protruding from a substrate, the nanowire structure comprising a channel region between a source region and a drain region, the channel region having a first width;
   disposing a silicide region between the source region and the substrate, the silicide region comprising an upper portion adjacent to and annularly surrounding the source region, the upper portion having a second width, and a lower portion adjacent to the substrate and annularly surrounding the source region, the lower portion having a third width greater than the second width, the second width substantially equal to the first width; and
   surrounding a portion of the channel region with a metal gate.

4. The method of claim 3, wherein a ratio of the second width to the third width is from about 0.4 to about 0.9.

5. The method of claim 3, wherein a ratio of the second width to the first width is from about 1.05 to about 1.2.

6. The method of claim 3, further comprising forming an isolation feature isolating the substrate and the metal gate.

7. The method of claim 3, wherein the silicide region comprises titanium silicide, cobalt silicide, nickel silicide, platinum silicide, erbium silicide, or palladium silicide.

8. The method of claim 3, wherein the silicide region is substantially reverse T-shaped.

9. The method of claim 3, wherein the metal gate comprises Al, Cu, W, Ti, Ta, TiN, TiAl, TiAlN, TaN, TaC, NiSi, or CoSi.

10. The method of claim 3, wherein a cross-sectional shape of the nanowire structure is circular, square, or triangular.

11. The method of claim 3, wherein a cross-sectional shape of the nanowire structure is elliptical, rectangular, or trapezoidal.

12. A method of forming a semiconductor device, the method comprising:

providing a nanowire structure protruding from a substrate, the nanowire structure comprising a channel region between a source region and a drain region, the channel region having a first outer diameter;

forming a silicide region, the silicide region comprising a vertical portion adjacent to and annularly disposed around the source region, the silicide region further comprising a horizontal portion adjacent to the substrate and annularly disposed around the source region, wherein a second outer diameter of the vertical portion is substantially equal to the first outer diameter; and disposing a metal gate around a portion of the channel region.

13. The method of claim 12, wherein a ratio of the second outer diameter to the first outer diameter is from about 0.1 to about 0.5.

14. The method of claim 12, wherein a ratio of the second outer diameter to a third outer diameter of the horizontal portion is from about 0.05 to about 0.3.

15. The method of claim 12 further comprising an isolation feature to isolate the substrate and the metal gate.

16. The method of claim 12, wherein the silicide region comprises titanium silicide, cobalt silicide, nickel silicide, platinum silicide, erbium silicide, or palladium silicide.

17. The method of claim 12, wherein the silicide region is substantially L-shaped.

18. The method of claim 12, wherein forming the silicide region comprises an annealing process.

19. The method of claim 12, wherein a cross-sectional shape of the nanowire structure comprises a circle, square, or triangle.

20. The method of claim 12, wherein a cross-sectional shape of the nanowire structure comprises an ellipse, rectangle, or trapezoid.

* * * * *